United States Patent

[11] 3,586,885

[72] Inventor Robert L. Dudley
Loveland, Colo.
[21] Appl. No. 808,788
[22] Filed Mar. 20, 1969
[45] Patented June 22, 1971
[73] Assignee Hewlett-Packard Company
Palo Alto, Calif.

[54] SQUARE WAVE GENERATOR
2 Claims, 2 Drawing Figs.

[52] U.S. Cl. .......... 307/268, 307/261, 307/322, 307/286
[51] Int. Cl. .......... H03k 5/04
[50] Field of Search .......... 307/261, 268, 286, 322

[56] References Cited

UNITED STATES PATENTS

| | | | |
|---|---|---|---|
| 3,162,771 | 12/1964 | Hilsenrath et al. .......... | 307/286 |
| 3,183,375 | 5/1965 | Harrison .......... | 307/286 |
| 3,441,750 | 4/1969 | Kawashima et al. .......... | 307/261 |

OTHER REFERENCES

" The Tunnel Diode As A Pulse Generator" by Mauch Electronic Industries, Feb. 1961, pages 106 and 107 (copy in Class 307 Sub 261).

*Primary Examiner*—Donald D. Forrer
*Assistant Examiner*—Harold A. Dixon
*Attorney*—Stephen P. Fox

ABSTRACT: A sine wave is applied to a negative resistance element which converts the sine wave into a square wave. Both positive and negative portions of the sine wave are applied to the negative resistance element through an input resistor. In addition, the negative portions are applied to the negative resistance element through a high pass filter circuit including a series coupled capacitor, resistor and diode. The high pass filter circuit permits the negative portions of the sine wave at high frequencies to pretrigger the negative resistance device, thereby to enhance the symmetry of the square wave output.

INVENTOR
Robert L. Dudley
BY
Mortenson and Weigel
ATTORNEYS

SQUARE WAVE GENERATOR

BACKGROUND OF THE INVENTION

It is known to use negative resistance devices such as tunnel diodes in switching applications such as converting a sine wave into a square wave. Tunnel diodes are of particular interest because of their very high switching speeds. In fact, since the so-called "tunneling effect" in tunnel diodes takes place at the speed of light, the transient response of the tunnel diode is limited essentially by the parasitic capacitances and storage effects in the tunnel diode itself. With appropriate driving signals, switching times in the order of nanoseconds (ns) are quite typical. Thus, at the lower frequencies, typically below 100 kilohertz (KHz.) relatively symmetrical square wave signals may be obtained using these switching devices. At the higher frequencies, however, the problems encountered with the parasitic capacitances, storage effects and forward-biased diode effects on the tunnel diodes tend to cause the waveform to become asymmetrical. The forward-biased diode effects result, as is known, from the tunnel diode characteristic whereby the voltage and current change necessary to trigger a forward-biased tunnel diode is larger than that required to initially trigger the tunnel diode.

It is, therefore, an object of this invention to obviate many of the disadvantages of the prior art square wave generators.

Another object of this invention is to provide an improved square wave generator capable of providing an output signal symmetrical about its time axis.

BRIEF DESCRIPTION OF THE INVENTION

In a preferred embodiment of the invention, a square wave generator includes a tunnel diode and means for forward biasing the tunnel diode. An alternating current signal applied across the tunnel diode converts the signal into a train of pulses having a rectangular waveform. To ensure symmetry of the pulse waveform about the time axis at high frequencies, a high pass filter, responsive to a predetermined sense of polarity change each cycle of the alternating current signal, applies a reverse-going voltage bias across the tunnel diode at these higher frequencies. This reverse-going bias voltage functions to pretrigger the switching time so that the parasitic capacitances, storage effects, and forward diode characteristics of the tunnel diode do not cause excessive error in the symmetry of the waveform.

BRIEF DESCRIPTION OF THE DRAWINGS

The novel features which are considered characteristic of this invention are set forth with particularity in the appended claims. The invention itself, however, both as to its organization and method of operation, as well as additional objects and advantages thereof will be best understood from the following description when read in connection with the accompanying drawings in which:

DESCRIPTION OF THE PREFERRED EMBODIMENT

Figure 1:
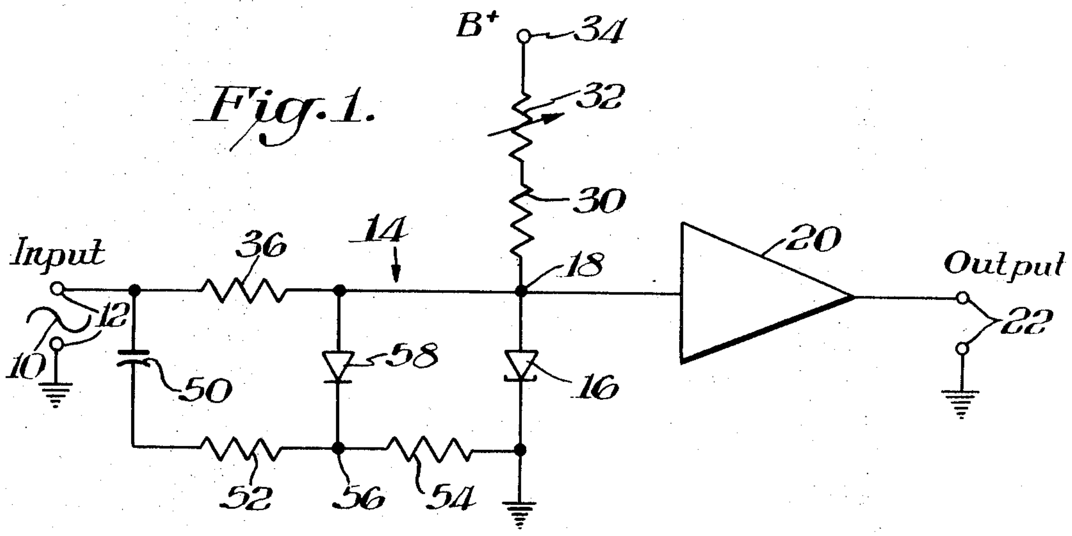
FIG. 1 is a partial block and partial schematic diagram of a square wave generating circuit constructed in accordance with the preferred embodiment of this invention.

In the drawing of FIG. 1 there is illustrated an otherwise conventional negative resistance switching circuit modified in accordance with this invention. More specifically, a sine wave input signal 10, which may be derived from a Wein bridge oscillator or other suitable circuit, is applied to the input terminals 12 of the switching circuit 14. The switching circuit 14 includes a tunnel diode 16 and the output of the switching circuit 14 is derived from a junction point 18 which is coupled to the P junction of the tunnel diode 16. The resulting square wave output from the switching circuit 14 is coupled to an amplifier 20 of conventional design. Preferably, the amplifier 20 is of a switching type capable of amplifying a square wave signal. One such type is an amplifier which drives a transistor to saturation to provide a flat top waveform. Appropriate clipping and/or peaking techniques may be used as desired to assure rapid rise and fall times. The output of the amplifier 20 is taken from a pair of output terminals 22.

Figure 2:
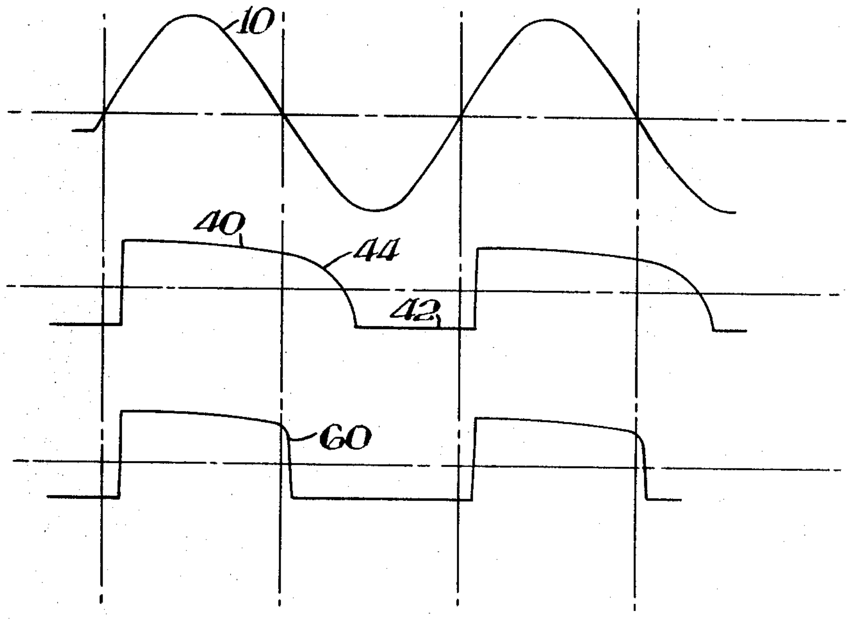
FIG. 2 represents a plurality of waveforms illustrating the operation of the circuit shown in FIG. 1.

The switching circuit 14 includes a fixed biasing resistor 30 and a variable biasing resistor 32 connected in series between the junction point 18 and a source of positive supply voltage denoted by the terminal 34. To complete the biasing voltage circuit necessary to normally forward bias the tunnel diode, a fixed resistor 36 is connected between the junction point 18 and the upper (in the drawing) input terminal 12. Thus constructed, with each positive-going cycle of the sine wave 10, which is illustrated most clearly in the A waveform of FIG. 2, as soon as a sufficiently positive voltage is applied across the tunnel diode 16 to raise the operating load line of the tunnel diode switching circuit, which includes the tunnel diode 16 and its load resistor (the biasing resistor 36) the operating condition of the tunnel diode switches in known manner to provide the square waveform designated by the numeral 40 in waveform B (FIG. 2). Conversely, when the sine wave 10 crosses the zero axis and becomes negative by a sufficient amount to again switch the operating condition of the tunnel diode, the negative portion 42 of the square waveform results. At low frequencies, this operation is quite satisfactory. The waveform is symmetrical as illustrated by the curve 60 in C. Unfortunately, however, at high frequencies, typically in the order of 100 kHz. and above, the parasitic capacitances, storage effects, and forward-biased diode effects on the tunnel diode cause the waveform derived across the tunnel diode at the junction point 18 to delay its switching operation, as denoted by the trailing edge 44 of the waveform 40.

In accordance with this invention, symmetry can be achieved at these higher frequencies by including in the circuit illustrated in FIG. 1, a series connected capacitor 50, resistor 52 and resistor 54 between the upper input terminal 12 and ground. At the junction point 56 between the fixed resistors 52 and 54 is connected the N junction or cathode of a diode 58. The anode or P junction of the diode 58 is connected to the output junction point 18. The addition of this circuitry, which in effect is a differentiating circuit or high pass filter connected between the input terminal and ground, is to permit the passage of high frequency signals to the junction point 56. The diode 58 selects only the negative-going signals and permits them to pass through the diode 58 to reduce the voltage at the junction 18 and hence pretrigger the tunnel diode 16 at a point in time earlier than it would normally be triggered. The pretriggering point is illustrated by the waveform 60 in FIG. 2.

Stated in another manner, the tunnel diode is pretriggered on a negative-going slope of the input sinusoidal waveform 10. This tends to correct for the symmetry error which occurs primarily with high frequency signals. The fixed resistors 52 and 54 in the differentiating circuit serve as a voltage divider to control the degree or time of pretrigger. The value of the differentiating capacitor 50 determines the frequency at which the pretriggering begins to take effect. Furthermore, adjustment of the resistor 32 may be used to control the low frequency symmetry of the waveform. There thus results the symmetrical waveform 60 which is applied to the amplifier 20. The square wave amplifier, in its typical operation may provide a large amplitude square wave signal utilizing only a small portion of the amplitude provided by the square wave generator of this invention. This aids in "squaring up" the waveform C.

In a typical circuit that has been operated successfully, the following values of components have been employed:

| | |
|---|---|
| Resistor 30 | 30.1 kilohms |
| Resistor 32 | 20 kilohms |
| Resistor 36 | 4.7 kilohms |
| Resistor 52 | 12.4 kilohms |
| Resistor 54 | 8.25 kilohms |
| Capacitor 50 | 5 picofarads |

Tunnel Diode 16 IN3712 Utilizing a circuit of this type a high degree of symmetry has been achieved of frequencies ranging up to 2 megahertz.

There has thus been described an economical, square wave generator that is capable of providing a symmetrical output waveform over a wide range of frequencies.

It is obvious that many embodiments may be made of this invention concept and that many modifications may be made in the embodiments hereinbefore described. Therefore, it is to be understood that all descriptive matter herein is to be interpreted merely as illustrative, exemplary, and not in a limited sense. It is intended that various modifications which might readily suggest themselves to those skilled in the art be covered by the following claims, as far as the prior art permits.

What I claim is:

1. A square wave generator for providing a symmetrical output waveform comprising, in combination:

a tunnel diode having a PN junction, means for forward biasing said tunnel diode, means including an input resistor coupled in series with said tunnel diode for applying a bipolar alternating current signal across said tunnel diode, thereby to convert said signal into a train of pulses having rectangular waveform, and high pass filter means including a capacitor, a resistor and unidirectional conducting means coupled in series, said high pass filter means being coupled in parallel with said input resistor to conduct one polarity of each cycle of said bipolar alternating current signal for applying a reverse-going bias voltage across said tunnel diode, thereby to pretrigger the switching normally provided by said predetermined portion of said signal, whereby said symmetrical output waveform results.

2. A square wave generator according to claim 1, further including resistance means coupled to the junction of the resistor and the unidirectional conducting means of said high pass filter means to form a voltage divider with said resistor, wherein said unidirectional conducting means is coupled to apply a portion of any voltage developed across said last named resistor to said tunnel diode.